United States Patent
Narendar et al.

(10) Patent No.: US 7,501,370 B2
(45) Date of Patent: Mar. 10, 2009

(54) HIGH PURITY SILICON CARBIDE WAFER BOATS

(75) Inventors: Yeshwanth Narendar, Westford, MA (US); Richard F. Buckley, Shrewsbury, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 0 days.

(21) Appl. No.: 10/752,434

(22) Filed: Jan. 6, 2004

(65) Prior Publication Data
US 2005/0148455 A1 Jul. 7, 2005

(51) Int. Cl.
C04B 35/565 (2006.01)
C23C 16/00 (2006.01)
A47G 19/08 (2006.01)

(52) U.S. Cl. .................. 501/88; 211/41.18; 206/711; 206/832; 118/500

(58) Field of Classification Search ............. 501/87–92; 211/41.18; 206/711, 832; 118/500
See application file for complete search history.

(56) References Cited

U.S. PATENT DOCUMENTS

| | | | |
|---|---|---|---|
| 1,900,053 A | 3/1933 | Glidden | |
| 2,233,434 A | 3/1941 | Smith | |
| 3,219,182 A | 11/1965 | Cornwell, Jr. | |
| 3,951,587 A | 4/1976 | Alliegro et al. | |
| 4,836,965 A | 6/1989 | Hayashi et al. | |
| 4,859,385 A | 8/1989 | Tanaka et al. | |
| 4,889,686 A | 12/1989 | Singh et al. | |
| 4,900,531 A | 2/1990 | Levin | |
| 4,944,904 A | 7/1990 | Singh et al. | |
| 4,978,567 A * | 12/1990 | Miller | 428/157 |
| 4,981,822 A | 1/1991 | Singh et al. | |
| 4,982,068 A | 1/1991 | Pollock et al. | |
| 4,998,879 A | 3/1991 | Foster et al. | |
| 5,021,367 A | 6/1991 | Singh et al. | |
| 5,043,303 A | 8/1991 | Singh et al. | |
| 5,079,039 A | 1/1992 | Heraud et al. | |
| 5,194,330 A | 3/1993 | Vandenbulcke et al. | |
| 5,238,619 A | 8/1993 | McGuigan et al. | |
| 5,494,439 A | 2/1996 | Goldstein et al. | |
| 5,494,524 A | 2/1996 | Inaba et al. | |
| 5,509,555 A | 4/1996 | Chiang et al. | |

(Continued)

FOREIGN PATENT DOCUMENTS

CA 2 466 183 A1 5/2003

(Continued)

OTHER PUBLICATIONS

Machine Translation of Japanese document 10-228974, Aug. 1998.*

(Continued)

*Primary Examiner*—Karl E Group
(74) *Attorney, Agent, or Firm*—Larson Newman Abel Polansky LLP

(57) ABSTRACT

A high purity ceramic article having a typical pore size of at least about 15 μm and an active impurity concentration of less than about 400 ppm can be prepared by molding ceramic powder, sintering to vaporize any active impurity components, washing to dissolve any remaining active impurity components with an acid solution, and oxidizing to remove any residual active impurity components.

15 Claims, 9 Drawing Sheets

U.S. PATENT DOCUMENTS

| | | | |
|---|---|---|---|
| 5,514,439 A * | 5/1996 | Sibley | 428/64.1 |
| 5,538,230 A | 7/1996 | Sibley | |
| 5,589,116 A * | 12/1996 | Kojima et al. | 264/628 |
| 5,628,938 A | 5/1997 | Sangeeta et al. | |
| 5,738,908 A | 4/1998 | Rey et al. | |
| 5,752,609 A | 5/1998 | Kato et al. | |
| 5,770,324 A * | 6/1998 | Holmes et al. | 428/688 |
| 5,834,387 A | 11/1998 | Divakar et al. | |
| 5,846,611 A | 12/1998 | Christin | |
| 5,897,311 A | 4/1999 | Nishi | |
| 5,904,892 A * | 5/1999 | Holmes | 264/650 |
| 5,942,454 A * | 8/1999 | Nakayama et al. | 501/88 |
| 6,024,898 A | 2/2000 | Steibel et al. | |
| 6,062,853 A | 5/2000 | Shimazu et al. | |
| 6,066,572 A | 5/2000 | Lu et al. | |
| 6,093,644 A | 7/2000 | Inaba et al. | |
| 6,099,645 A | 8/2000 | Easley et al. | |
| 6,162,543 A * | 12/2000 | Dubots et al. | 428/408 |
| 6,277,194 B1 | 8/2001 | Thilderkvist et al. | |
| 6,296,716 B1 | 10/2001 | Haerle et al. | |
| 6,357,604 B1 | 3/2002 | Wingo | |
| 6,379,575 B1 | 4/2002 | Yin et al. | |
| 6,383,298 B1 | 5/2002 | Ross et al. | |
| 6,395,203 B1 | 5/2002 | Brun | |
| 6,401,941 B1 | 6/2002 | Maumus | |
| 6,403,155 B2 * | 6/2002 | Dubots et al. | 427/255.12 |
| 6,410,088 B1 | 6/2002 | Robin-Brosse et al. | |
| 6,455,160 B1 | 9/2002 | Hiraoka et al. | |
| 6,488,497 B1 | 12/2002 | Buckley et al. | |
| 6,536,608 B2 | 3/2003 | Buckley | |
| 6,565,667 B2 | 5/2003 | Haerle et al. | |
| 6,617,540 B2 | 9/2003 | Zehavi | |
| 6,670,294 B2 * | 12/2003 | Kobayashi | 501/88 |
| 6,723,437 B2 | 4/2004 | Haerle et al. | |
| 6,776,289 B1 | 8/2004 | Nyseth | |
| 6,811,040 B2 | 11/2004 | Payne et al. | |
| 6,874,638 B2 | 4/2005 | Iijima et al. | |
| 6,890,861 B1 | 5/2005 | Bosch | |
| 2002/0113027 A1 | 8/2002 | Minami et al. | |
| 2002/0130061 A1 | 9/2002 | Hengst | |
| 2003/0198749 A1 | 10/2003 | Kumar et al. | |
| 2004/0129203 A1 | 7/2004 | Zehavi et al. | |

FOREIGN PATENT DOCUMENTS

| | | | |
|---|---|---|---|
| DE | 19749462 C1 | | 3/1999 |
| EP | 0582444 | * | 2/1994 |
| EP | 1 061 042 A1 | | 12/2000 |
| EP | 1 184 355 A1 | | 3/2002 |
| EP | 1 219 578 A2 | | 7/2002 |
| GB | 893 041 | | 4/1962 |
| GB | 1 394 106 | | 5/1975 |
| GB | 2 130 192 A | | 5/1984 |
| GB | 2130192 | * | 5/1984 |
| JP | 7-328360 | * | 12/1995 |
| JP | 10-228974 | * | 8/1998 |
| JP | 10-253259 | * | 9/1998 |
| JP | 11209115 A | | 8/1999 |
| JP | 2000044223 | | 2/2000 |
| JP | 2002 338 366 A | | 11/2002 |
| JP | 2002338366 | * | 11/2002 |
| WO | WO 00/18702 A1 | | 4/2000 |
| WO | WO 02/09161 A2 | | 1/2002 |

OTHER PUBLICATIONS

Machine Translation of Japanese Document 07-328360, Dec. 1995.*

H. Rauh, "Atlas for Characterization of Defects in Silicon," Wacker Siltronic AG, Burghausen, Germany, pp. 1-64, 2004.

R. F. Buckley et al., "Design and Analysis of a Semiconductor Wafer Processing System for 30 mm Wafers," MS Thesis submitted to the Worcester Polytechnic Institute, Dec. 22, 1999, pp. i-62.

B. Leroy et al., "Warpage of Silicon Wafers," *Journal Electrochemical Society*, vol. 127, No. 4, Apr. 1980, pp. 961-970.

M. Schrems et al., "Simulation of Temperature Distributions During Fast Thermal Processing," *Journal Electrochemical Society*, Semiconductor Silicon 1994, pp. 1050-1059.

Nilson et al., "Scaling wafer stresses and thermal processes to large wafers," *Thin Solid Films* 315, 1998, pp. 286-293.

Peter Van Zant, "Microchip Fabrication: A Practical Guide to Semiconductor Processing," McGraw Hill, Fourth Edition, 1990, chapters 3-7.

Shigley et al., "Mechanical Engineering Design," McGraw Hill, copyright 1989, p. 62, p. 159.

Machinery Handbook, 24th Edition, Industrial Press, Copyright 1992, pp. 1598-1603.

Hyper-Therm High-Temperature Composites, Inc. "Ceramic-Matrix Composites", Feb. 27, 2003, Huntington Beach, CA, U.S.A., Copyright 2000, printed from http://www.htcomposites.com/fiber_reinforced_ceramics_technology.htm, printed on Aug. 11, 2006.

Daihan Scientific "Daihan" Alumina Crucible, B-from, General - type, Copyright 2004, printed from http://www.daihan-sci.com/catalogs_detail.asp?itemgrnum=1499 &productgrname=Crucibles& productgrn..., printed on Aug. 11, 2006.

Wolf, et al., "Silicon Processing for the VLSI Era, vol. 1", Process Technology, 1986 Lattice Press, pp. 215-216.

Ghandhi, "VLSI Fabrication Principles, Silicon and Gallium Arsenide", 1983, John Wiley and Sons, pp. 517-520.

* cited by examiner

HIGH PURITY SILICON CARBIDE WAFER BOATS

BACKGROUND OF THE INVENTION

1. Field of the Invention

The present invention relates to ceramic articles and, in particular, high purity ceramic articles suitable for use as articles used to fabricate semiconductor materials.

2. Discussion of the Related Art

Although other materials may be used, e.g., Silicon-Germanium (SiGe) or Gallium Arsenide (GaAs), Silicon (Si) is presently the most important semiconductor for the electronics industry. Very Large Scale Integrated (VLSI) circuit technology (i.e., up to about 100,000 devices per chip), and Ultra Large Scale Integrated (ULSI) circuit technology (i.e., more than 100,000 and in some cases exceeding one billion devices per chip) are based almost entirely on silicon.

The fabrication of VLSI and ULSI circuits generally takes place on silicon substrates that possess very high crystalline perfection or purity. That is, in crystalline solids, the atoms which make up the solid are spatially arranged in a periodic fashion. If the periodic arrangement exists throughout the entire solid, the substance is defined as being formed of a single crystal. The periodic arrangement of the atoms in the crystal is called the lattice. Very high crystalline perfection requires that the silicon substrate possess a minimum of impurities and structural defects throughout its single crystal silicon lattice.

Generally, raw material, e.g., quartzite, is refined into electronic grade polysilicon (EGS) and melted. A silicon seed crystal is than used to grow a single crystal silicon ingot from the molten EGS. The ingot is then precisely sliced and polished into silicon wafers. The silicon wafers provide the substrates upon which VLSI and ULSI circuits are ultimately built through a complex sequence of wafer fabrication processes.

The increasing size of silicon wafers is one of the most obvious trends in silicon material technology. Presently, 300 mm diameter wafers are expected to ultimately replace most 150 mm and 200 mm wafer applications, and it is predicted that 400 mm wafers will be introduced in the near future. The use of larger diameter wafers presents several major challenges to semiconductor manufactures. For example, facilities with equipment capable of handling the larger wafers, e.g., vertical furnaces, must be built. New patterning techniques must be developed to print smaller feature sizes over larger areas. The larger wafers must also be thicker to increase their resistance to warping and other structural deformations. Moreover, the larger wafers are also heavier, requiring the use of automated wafer transport systems.

As the silicon wafers become bigger and heavier, the problem of preventing impurities and structural defects to the lattice, i.e., of maintaining very high crystalline perfection, becomes even more critical. Two such structural defects, which become especially problematic in 300 mm silicon wafers and larger, are "back side damage" and "slip" in the lattice structure.

Back side damage generally occurs when a wafer moves across a surface of a wafer support device, causing scratches in the back side of the wafer.

Slip in silicon wafers is a function of the stress applied to the wafer. This stress can be mechanical (e.g., frictionally induced) and/or thermal. As the wafers are stressed, the crystal lattice undergoes elastic deformation that disappears as the solid crystal returns to its original position upon release of the stress. However, severe stress leads to slip, which is the plastic or permanent deformation in the crystal lattice, which remains when the stress is released. Slip occurs when the elastic limit (or yield strength) of the silicon is exceeded and the lattice becomes permanently misaligned.

Slip is common during high temperature processing of silicon wafers in heat treatment furnaces (furnacing operations), as thermal stress is proportional to the processing temperature. The transition temperature from brittle to ductile behavior of the wafer is generally within the range of about 720 to 1000 degrees Celsius. Therefore slip, whether induced by thermal or mechanical stress, becomes especially problematic at process temperatures above 720 degrees Celsius.

Wafer carriers or boats are wafer support devices, which are subjected to furnacing operations during semiconductor wafer processing. Horizontal wafer boats are typically designed to support a horizontal row of wafers, which are inserted into a horizontal furnace tube for high temperature processing. Vertical wafer boats are typically designed to support a vertical stack of wafers, which are inserted into a vertical furnace tube. Generally, for large diameter silicon wafers, e.g., 300 mm, vertical wafer boats are more commonly used. This is because vertical furnaces have a smaller foot print than horizontal furnaces and therefore take up less of the expensive manufacturing space. Additionally, vertical furnaces generally demonstrate better temperature control than horizontal furnaces.

Wafer boats are generally composed of ceramic materials. Ceramic materials, which are joined by ionic or covalent bonds, are typically composed of complex compounds containing both metallic and non-metallic elements. Ceramics typically are hard, brittle, high melting point materials with low electrical and thermal conductivity, good chemical and thermal stability, and high compressive strengths. Examples of ceramic materials are quartz, silicon carbide (SiC) and recrystallized silicon carbide. One such recrystallized silicon carbide is available from Saint-Gobain Ceramics & Plastics, Inc., of Worcester, Mass., under the trade name CRYSTAR®. This material is a silicon carbide ceramic that has been impregnated with high purity silicon, and is also called siliconized silicon carbide. Conventional wafer boats formed from siliconized silicon carbide typically have a base or core of about 75% to 90% dense silicon carbide coated with silicon with a density of at least 99%. Referring to FIG. 1, a typical prior art vertical wafer boat 10 generally includes three or four support rods 12 extending vertically upwards from a generally circular horizontal base 14, and spaced radially along the periphery of the base. The rods 12 have a plurality of cantilevered wafer support arms (or teeth) 16 supported only at one end, which extend inwardly toward the center of the base 14 to define a series of slots therebetween. The slots are sized to receive the silicon wafers, which are supported by the arms 16 during furnacing operations.

Problematically for larger wafers, the prior art wafer support arms 16 provide most of their support at the outer periphery of the wafer. Accordingly, most of the weight of the wafer is unsupported and distributed toward its center. Therefore, during high temperature thermal processing, the center of the wafers tends to sag, promoting slip in the crystal lattice of the wafer.

Because of the geometry of the circular wafers, substantially half of the weight of the wafer, i.e., the inner wafer weight, is distributed within a circular area that is 70 percent the radius (R) of the wafer. Conversely, half of the weight of the wafer, i.e., the outer wafer weight, is distributed over a doughnut shaped area that has an inner radius of 0.7 R and an outer radius of 1.0 R. As a result, supporting the wafers at or about the 0.7 R circular boundary region of a wafer, e.g., from 0.6 R to 0.8 R, balances the inner and outer wafer weights and greatly reduces the potential for sagging during high temperature thermal processing.

Current prior art boat designs require deep slots, thereby making the arms 16 of the support rods 12 long enough to extend to the 0.7 R point. However, manufacturing this geometry is cumbersome due to the precise machining required and the inherently low yield rates. Also the added length of the cantilevered arms imposes a large moment force at the single support point where the arm attaches to the rod body, unduly increasing the probability of failure or breakage. Moreover, because the arms provide support at only three or four small discrete areas on the wafers, the possibility of back side damage is enhanced for the heavier wafers.

One prior art attempt to solve this problem was to provide a plurality of discrete circular ceramic rings having an inner radius smaller than 0.7 R and an outer radius greater than 0.7 R. The rings would be slid into each slot and the wafers would then rest upon each ceramic ring.

However, each ring typically costs in the range of one thousand to two thousand dollars to manufacture, greatly adding to the cost of the boat. Additionally, the rings essentially enclose the support area where the wafers rest. This makes it difficult for conventional transfer equipment to get between the rings and wafers in order to remove the wafers from the slots. Additionally, the enclosed design impedes the free flow of gasses that are often important to the processing of the wafers. Also, since the rings typically add up to 100 additional discrete moving parts to the boats (one for each slot), the potential for generating particles or other impurities is greatly enhanced. That is, the ceramic rings can rub against the wafer support arms during processing or handling, and frictionally rub off microscopic particles which can damage the semiconductor circuitry of the wafers.

SUMMARY OF INVENTION

According to one aspect of the present invention, a wafer boat is provided. The wafer boat comprises a base plate, a top plate, a plurality of support rods, and a plurality of wafer supports. The plurality of support rods are disposed about a perimeter of the base plate and extend between the base plate and the top plate. Each support rod of the plurality of support rods has a first distal end that is attached to the base plate and a second distal end that is attached to the top plate, each support rod including a plurality slots formed therein that define a plurality of teeth. The plurality of wafer supports are adapted to be received in a corresponding slot of each of the plurality of support rods. Each of the plurality of wafer supports has a continuous open shape and includes a pair of leg sections that form an interference fit with at least two of the plurality of support rods. According to one embodiment, the plurality of wafer supports may be removable, such that one or more of the wafer supports may be inserted and/or removed on site (e.g., at the location where the wafer boat is being used).

According to another aspect of the present invention, a wafer boat body adapted to receive a plurality of wafer supports is provided. The wafer boat body comprises a base plate, a top plate, and a plurality of support rods disposed about a perimeter of the base plate and extending between the base plate and the top plate. Each support rod of the plurality of support rods has a first distal end that is attached to the base plate and a second distal end that is attached to the top plate, each support rod including a plurality slots formed therein that define a plurality of teeth. A top surface of each of the plurality of teeth of each of the plurality of support rods is adapted to support a respective wafer support of the plurality of wafer supports, and corresponding slots in at least two of the plurality supports rods form an interference fit with portions of the respective wafer support.

According to yet another aspect of the present invention, a wafer support for use in a wafer boat body is provided to support a wafer having a predetermined radius R. The wafer boat body has a plurality of vertical support rods, each of the plurality of vertical support rods including a plurality of slots formed therein that define a plurality of teeth. The wafer support comprises a continuous flat member having an open shape and including a plurality of inter-connected arcuately curved sections. Two of the arcuately curved sections define an arc of approximately ninety degrees and are adapted to support the wafer at approximately a 0.7 R boundary region of the wafer. Each of the two arcuately curved sections is connected to a respective leg section that terminates in a free distal end. Each of the free distal ends of the continuous flat member is shaped to form an interference fit with a slot of a respective one of the plurality of vertical support rods.

According to a further aspect of the present invention, a method of configuring a wafer boat for use in semiconductor processing operations is provided. The wafer boat includes a plurality of vertical support rods disposed about a perimeter of the wafer boat, each of the plurality of vertical support rods having a plurality of slots formed therein that define a plurality of teeth. The method comprises acts of (a) receiving a wafer support formed from a continuous flat member having an open shape and including a plurality of inter-connected arcuately curved sections, two of the arcuately curved sections defining an arc of approximately ninety degrees and being connected to a respective leg section; (b) flexing the respective leg sections toward one another; (c) inserting the wafer support into corresponding slots in each of the plurality of vertical support rods during the act (b); and (d) releasing the respective leg sections so that a portion of each respective leg section forms an interference fit with a respective one of the plurality of vertical support rods.

In accordance with one or more embodiments, the present invention provides a method of fabricating a ceramic article. The method can comprise forming a molded component comprising a ceramic powder comprising silicon carbide and sintering the molded component at about 2200° to about 2500° C. to produce a sintered component having an impurity component concentration of less than about 400 ppm.

In accordance with one or more embodiments, the present invention provides an article. The article can comprise a ceramic material selected from the group consisting of silicon carbide, silicon nitride, and aluminum oxide. The ceramic material can have a pore size of at least about 15 μm and an active impurity component at a concentration of less than about 400 ppm.

In accordance with one or more embodiments, the present invention provides a method of fabricating a component of a wafer boat. The method can comprise providing a molded component comprising a ceramic selected from the group consisting of silicon carbide, silicon nitride, and aluminum oxide; sintering the molded component at a temperature of about 2200° to about 2500° C. to form a sintered wafer boat component; washing the sintered wafer boat component with an acid solution comprising at least one acid selected from the group consisting of hydrofluoric acid, hydrochloric acid, and nitric acid; and rinsing the sintered wafer boat component with water.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE INVENTION

Figure 1:
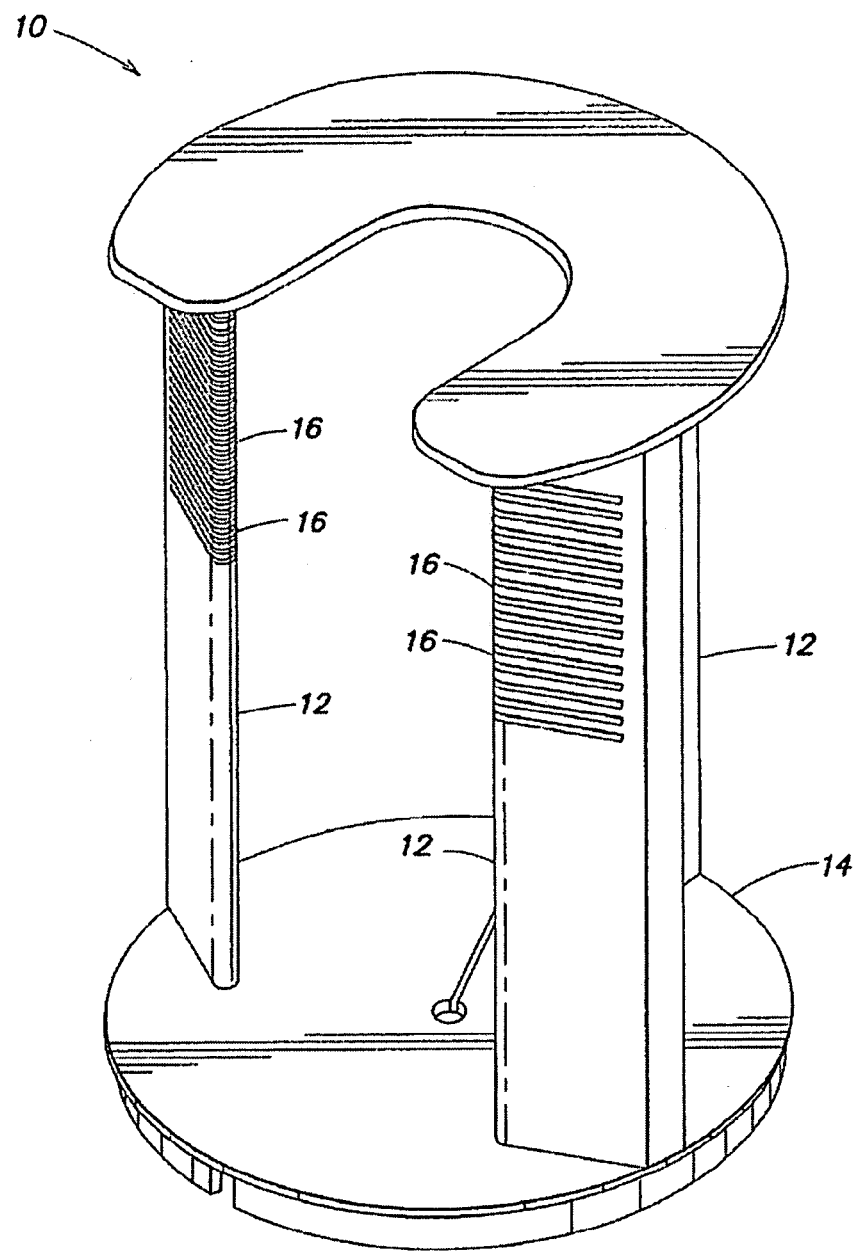
FIG. 1 is a perspective view of a vertical wafer boat according to the prior art.

This invention is not limited in its application to the details of construction and the arrangement of components set forth in the following description or illustrated in the drawings. The invention is capable of providing other embodiments and of being practiced or of being carried out in various ways. In addition, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Referring to FIGS. 2-8, a vertical wafer carrier or boat in accordance with one embodiment of the present invention is shown generally at 100. In this embodiment, the body of the wafer boat 100 is formed from a sintered ceramic material, such as silicon carbide, although other ceramic materials such as quartz, silicon impregnated silicon carbide, sapphire, or combinations of these materials may alternatively be used. The body of the wafer boat 100 typically includes a plurality of vertical support rods 110, a base 125, and a top plate 130, 830 (shown in phantom in FIG. 2, but illustrated in FIGS. 7 and 8). The wafer boat 100 also includes a plurality of wafer supports 140 that form an interference fit with one or more of the plurality of vertical support rods 110 of the body. As will be explained in greater detail below, the body of the wafer boat 100 is preferably monolithically formed from a sintered ceramic material, such as silicon carbide, and may be sized to provide arcuate support for silicon wafers of different sizes. According to one aspect of the present invention, the plurality of wafer supports 140 may be inserted and removed from the body of the wafer boat 100 and may form a removable interference fit with one or more of the vertical support rods 110 of the body of the wafer boat 100. Advantageously, this design of the wafer boat 100 permits one or more of the wafer supports 140 to be installed, removed, and/or replaced on site, while also providing a wafer support surface that reduces slip in the silicon wafers during processing, avoids backside damage to the wafer during processing and wafer transfer operations, and provides an open area for wafer transfer equipment to easily handle and manipulate the wafers.

The base 125 of the wafer boat 100 is typically generally circular in shape and includes a generally horizontal flat base plate 120 having a predetermined diameter. The base 125 may include a plurality of feet 126 that are spaced apart from one another about a perimeter of the under-surface of the base plate 120. In the illustrated embodiment, the plurality of feet include four feet disposed at approximately 90° apart from one another, with three of the four feet being disposed below each of the three vertical support rods 110. It should be appreciated that more or fewer feet may be provided, or alternatively rather than feet, a vertical rim may be provided, as described in commonly assigned U.S. Pat. No. 6,488,497 (hereinafter the '497 patent) which is hereby incorporated by reference in its entirety. As described in the '497 patent, where a vertical rim is used, the vertical rim may include a locating notch (e.g., locating notch 36 in FIG. 2 of the '497 patent) to orient the wafer boat 100 in a predetermined position when placed in a vertical furnace (not shown) during a furnacing operation.

An expansion slot 122 is cut radially outward from a center hole 124 in the base plate 120. The expansion slot 122 extends through the outer periphery of the base plate 120, and allows for thermal expansion and contraction of the base 125 during thermal operations, e.g., furnacing operations. Although not illustrated, the base 125 may include a locating feature (such as a protrusion or the notch 36 illustrated in FIG. 2 of the '497 patent) that may be used to position the wafer boat 100 in a particular orientation.

The vertical support rods 110 are elongated structures having a typically generally rectangular shaped cross-section that are spaced approximately equally apart about the perimeter of the base 125. The radially outer edges of the vertical support rods 110 are disposed approximately flush against the outer periphery of the base plate 120, and may have a slightly arcuate outer profile that matches that of the base plate 120 to which they are mounted. The vertical support rods 110 may be welded to the upper surface of the base plate 120 at their lower distal ends and extend substantially vertically upward therefrom. The upper distal ends of the vertical support rods may be welded to the lower surface of the top plate 130, 830 (illustrated in FIGS. 7 and 8), which may be a circularly-shaped plate (e.g., top plate 130 of FIG. 7), or alternatively a C-shaped flat plate (e.g., top plate 830 of FIG. 8) that extends substantially parallel to the base plate 120. Although the vertical support rods 110, base plate 120 and top plate 130, 830 are described as being welded together to form a single monolithic structure, other assembly techniques are also within the scope of this invention, e.g., bolting, press fitting, or chemically bonding the components together. Further, mounting slots may be formed in a top surface of the base plate 120 and/or an under-surface of the top plate 130, 830 into which the support rods may be press fit and held in a fixed relation to each other. The combination of the top plate 130, 830 and the base 125, when appropriately secured to the vertical support rods 110, forms a rigid structure in which wafers may be supported.

Each of the vertical support rods 110 may include a plurality of slots 114 (shown most clearly in FIG. 5) which define a plurality of teeth 112. The upper surface of each of the teeth 112 may be used to support a wafer support 140 that when inserted, forms a positive interference fit with one or more of the plurality of vertical support rods 110. Although each of the plurality of teeth 112 is illustrated as being disposed a fixed distance from an adjacent tooth, it should be appreciated that the present invention is not so limited. Indeed, to control the distribution of process gases and other substances used during wafer processing, the spacing of teeth in one portion of the vertical support rods may be different from that of another portion. For example, the teeth disposed at the upper and lower distal ends of the vertical support rods 110 may be spaced farther apart than those disposed in the central portion of the vertical support rods 110.

Figure 2:
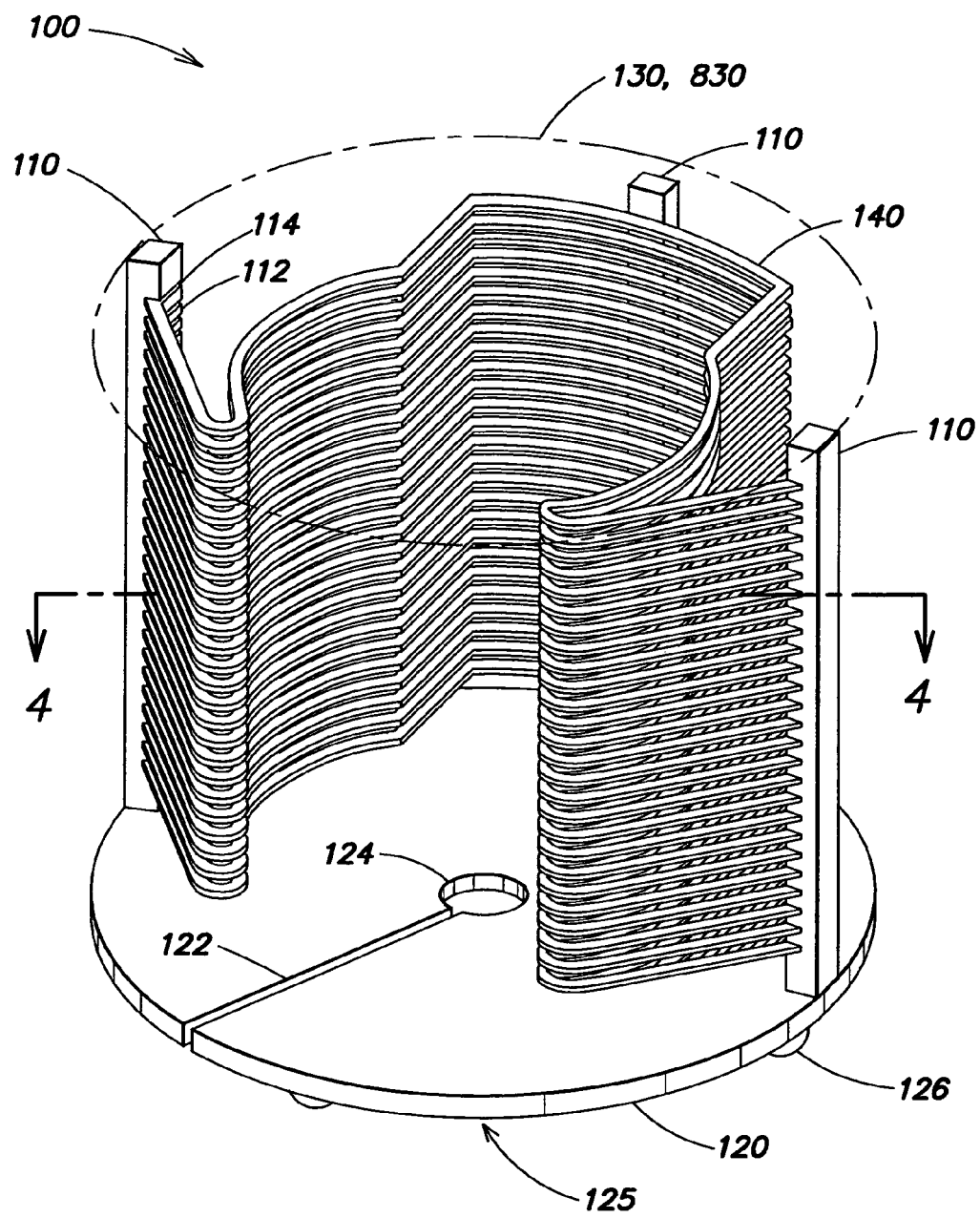
FIG. 2 is a perspective view of a vertical wafer boat in accordance with an exemplary embodiment of the present invention.
Figure 7:
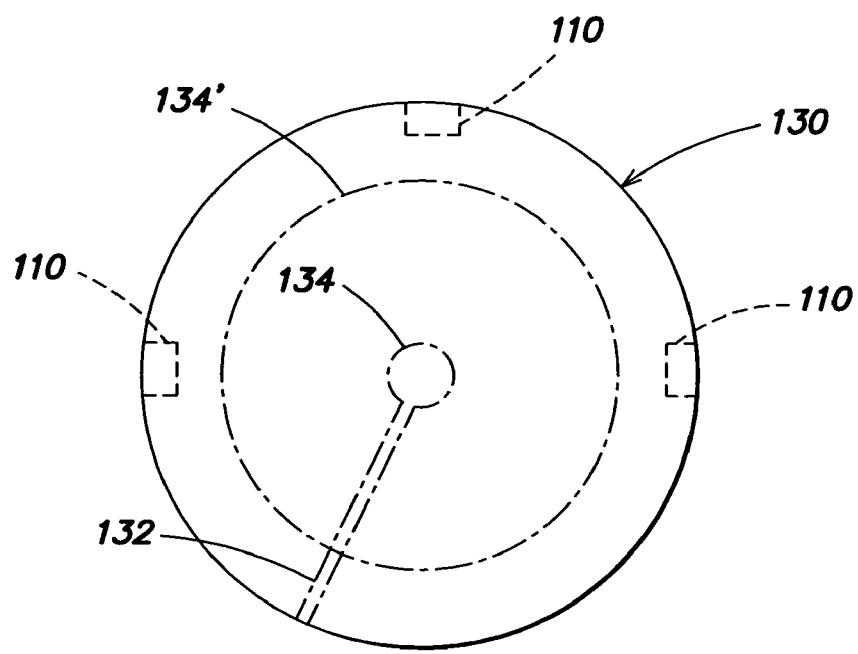
FIG. 7 is a top view of a top plate that may be used in conjunction with the vertical wafer boat of FIG. 2.
Figure 8:
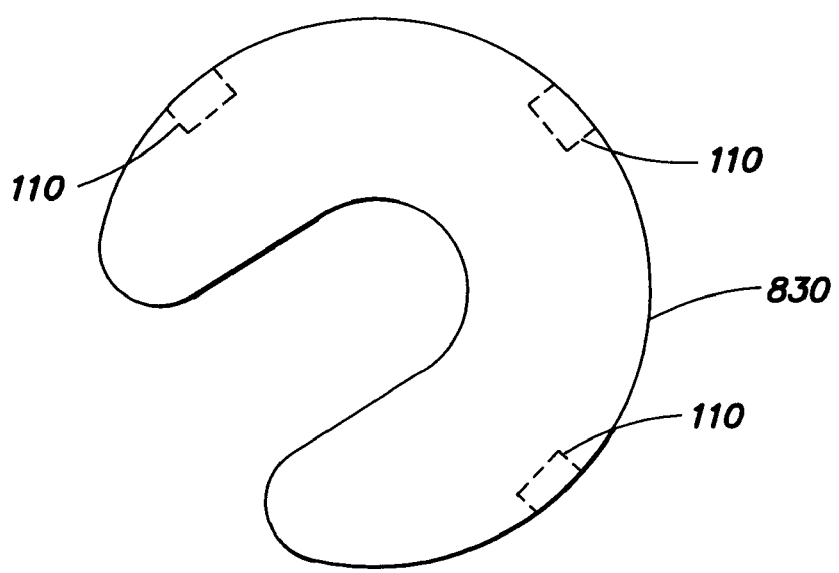
FIG. 8 is an alternative embodiment of a top plate that may be used with the vertical wafer boat of FIG. 2.

FIG. 7 is a top view of a top plate that may be used in conjunction with the vertical wafer boat of FIG. 2. As illustrated, the top plate 130 is a typically circularly shaped flat plate that may be formed, for example, from a sintered ceramic material, such as silicon carbide, and which is welded or otherwise securely and rigidly attached to the upper distal ends of the vertical support rods 110 (shown in phantom in FIG. 7) so as to be substantially parallel to the base plate 120. According to one embodiment of the present invention, the top plate 130 may be formed in a similar manner and using similar processing techniques as the bottom plate 120, such that the two plates are substantially identical. Thus, the top plate 130 may include an expansion slot 132 that is cut radially outward from a center hole 134 and which extends through the outer periphery of the top plate 130. The center hole 134 may be of the same diameter and placement, relative to the top plate 130 as in the base plate 120. Accordingly, the top plate 130 and the base plate 120 may expand and contract in a similar manner to avoid twisting of the wafer boat 100 during thermal operations, such as furnacing operations.

Alternatively, rather than having a shape that is similar to that of the base plate 120, the top plate 130 may have a larger diameter center hole 134' than that of the base plate. For example, as illustrated in phantom in FIG. 7, the center hole 134' may have a diameter that is approximately ¾ the size of the outer diameter of the top plate 130, with, or without an expansion slot 132 radiating outwardly therefrom. Alternatively still, the top plate may have an entirely different shape, such as the C-shape illustrated in FIG. 8. The open end of the C-shaped top plate 830 would typically be oriented above the expansion slot 122 in the base plate 120 to avoid twisting of the wafer boat 100 during thermal operations. Each of these top plates, when appropriate secured to the vertical support rods provides a wafer support boat that is rigid and stable.

Figure 3:
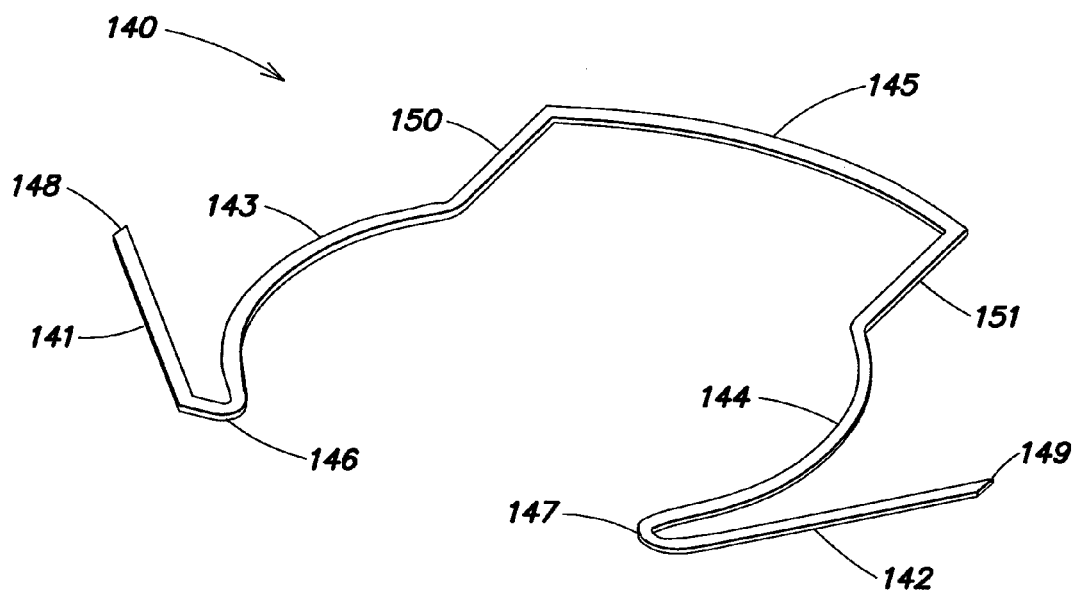
FIG. 3 is a perspective view of a wafer support according to an embodiment of the present invention which may be used with the vertical wafer boat depicted in FIG. 2.

FIG. 3 is a perspective view of a wafer support according to an embodiment of the present invention which may be used with the vertical wafer boat 100 depicted in FIG. 2. As shown in FIG. 3, the wafer support 140 is substantially flat and has a continuous open shape with leg sections 141, 142 on either side of the structure. By way of example only, Applicants have empirically determined that a wafer support having a thickness of approximately 1 to 5 mm, and more preferably a thickness 2.5 to 3.5 mm is sufficient to support a 300 mm wafer in connection with a wafer boat that includes three vertical support rods 110. It should be appreciated that the wafer supports may have other thicknesses, as the present invention is not limited to any particular thickness.

Figure 4:
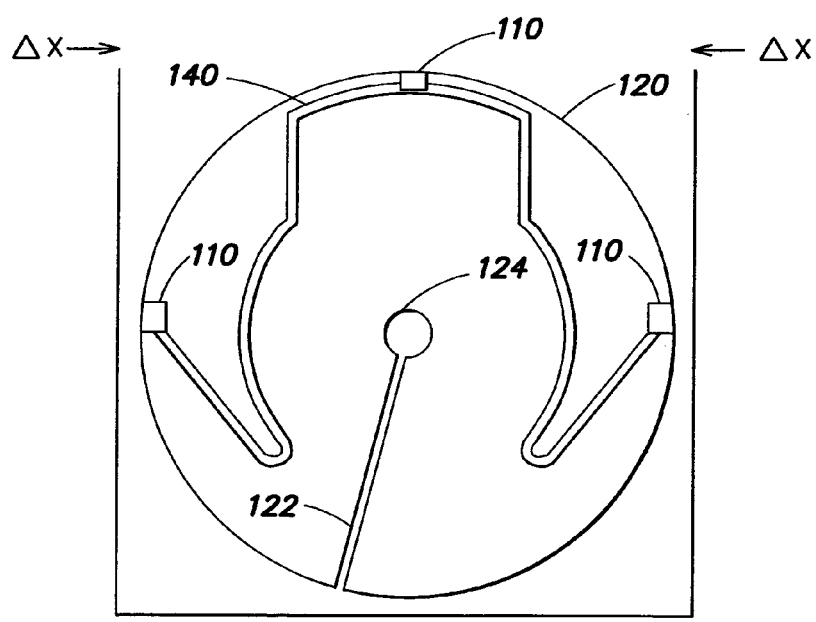
FIG. 4 is a top view of the wafer boat of FIG. 2 taken along the line 4-4.
Figure 5:
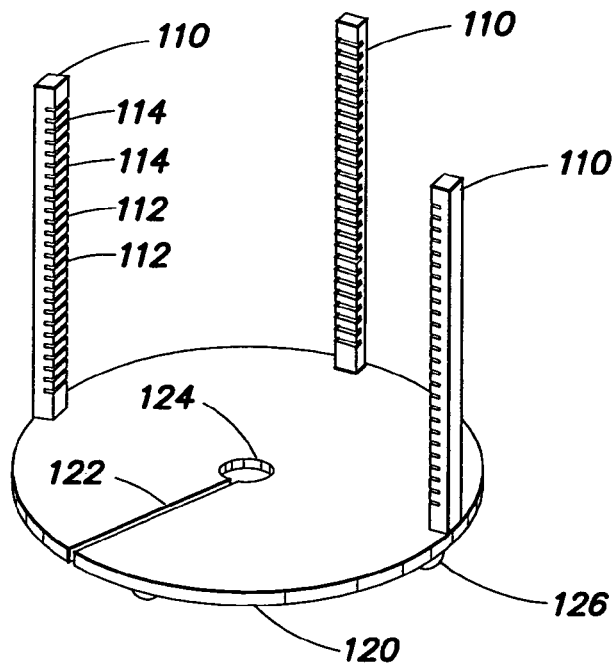
FIG. 5 is a perspective view of the vertical wafer boat of FIG. 2 with the top plate and each of the wafer supports removed.

The distal ends 148, 149 of each of the leg sections 141, 142 may be mitered to engage with the base portions of the slots 114 in two of the vertical support rods 110 (i.e., the two vertical support rods positioned at 3 o'clock and 9 o'clock as shown in FIG. 4). Preferably, this engagement occurs along a continuous line (rather than a single point) to avoid the possibility of particle generation during the insertion and/or removal of a wafer support 140.

The wafer support 140 also includes three arcuately curved sections 143, 144, and 145, with two of the three arcuately curved sections 143, 144 being configured to support a wafer upon their upper surfaces at about the 0.7 R boundary region of the wafers (where R is the radius of the wafer). In the illustrated embodiment, each of the arcuately curved sections 143, 144 spans an arc of approximately 90°. It should be appreciated that the arcuately curved sections 143, 144 may span more or less than this amount, as the present invention is not limited to a particular span, although an arc of approximately 90° has been empirically determined to be sufficient to support a wafer without sagging or slip, while also permitting the free flow of gases and providing ample room for wafer handling equipment. Each of the arcuately curved sections 143, 144 may be attached to a respective leg section 141, 142 by a rounded section 146, 147, respectively. The profile of the rounded sections 146, 147 reduces the possibility of fracture during insertion and/or removal of the wafer support 140. The third arcuately curved section 145 may span an arc of approximately 60° and is connected to each of the first two arcuately curved sections 143, 144 by a respective straight section 150, 151.

It should be appreciated that the wafer support 140 illustrated in FIG. 3 provides a number of advantages over other wafer support structures. For example, where the wafer support 140 is formed from a sintered ceramic material, such as silicon carbide, in the manner described in detail more fully below, the wafer support 140 possesses excellent rigidity in the vertical direction (i.e., into and out of the plane of the paper in FIG. 4) while being capable of flexing in a horizontal direction (e.g., left and right in the plane of the paper in FIG. 4). The relatively high modulus of elasticity of the sintered silicon carbide and the geometry of the wafer support 140 permits the leg sections 141, 142 to flex together under pressure to facilitate the insertion and/or removal of the wafer support in the wafer boat, while possessing sufficient rigidity to ensure a positive interference fit with the vertical support rods 110. The leg section displacement and applied force are linearly dependant. Given this relationship, the leg sections can be displaced while maintaining stress values below a given value. For example, when the wafer support 140 is formed from sintered silicon carbide in the manner described in detail below, an overall displacement of 2 mm creates silicon carbide stress levels at a Factor Of Safety of approximately the Modulus of Rupture divided by 6. This factor of safety is within accepted standards for silicon carbide parts, and permits the mitered ends 148, 149 to mate with the slots 114 in a positive interference fit.

Figure 6:
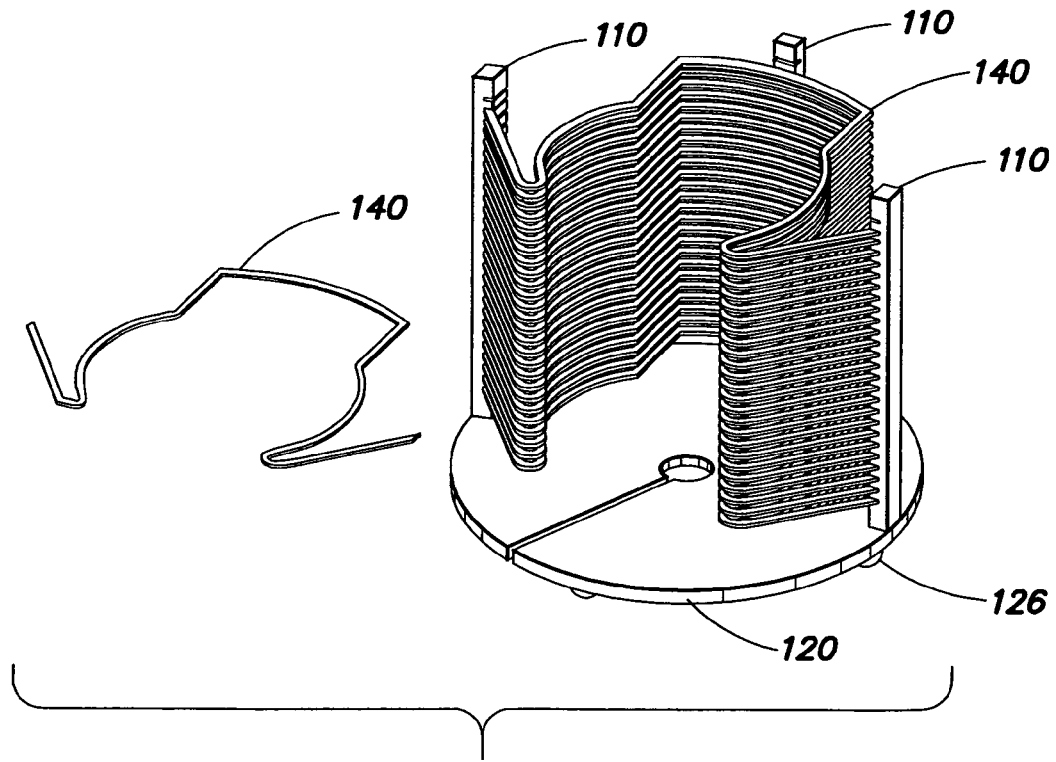
FIG. 6 is a perspective view of a vertical wafer boat in accordance with the present invention with the top plate removed and in which fewer than all of the wafer supports have been inserted.

The mitered shape of the distal ends 148, 149 of the leg sections 141, 142 may be configured to engage the base portion of the slots 114 along a line of contact, rather than at a single point to avoid particle generation during insertion and/or removal of the wafer support 140. As illustrated in FIG. 4, given the displacement and stress properties of this design, the leg sections may be displaced a certain distance X and be inserted into a rigid wafer boat designed to accept the wafer support 140. Once the wafer support 140 is fully in place, the leg sections 141, 142 can be allowed to gently spring back into position and form a positive interference fit with the slots 114 in the rigid wafer boat as illustrated in FIG. 6.

It should be appreciated that while a sintered ceramic material, such as silicon carbide, may be used to form the wafer support 140, other materials may alternatively be used, as the present invention is not limited to a particular type of material. Indeed, the geometry of the wafer support 140 may suitably be used with other types of ceramic materials and provide sufficiently rigidity in the vertical direction while still being flexible in the horizontal direction.

It should be appreciated that rather than relying on the wafer support 140 to provide sufficient rigidity in the vertical direction with flexibility in the horizontal direction, the vertical support rods may be designed to provide this functionality. For example, rather than being rigid, the vertical support rods forming the interference fit with the leg sections of the wafer support 140 could be sufficiently flexible so as to permit use with a wafer support 140 that was stiff in the horizontal direction. Alternatively still, both the wafer support and the vertical support rods could be flexible.

Figure 9:
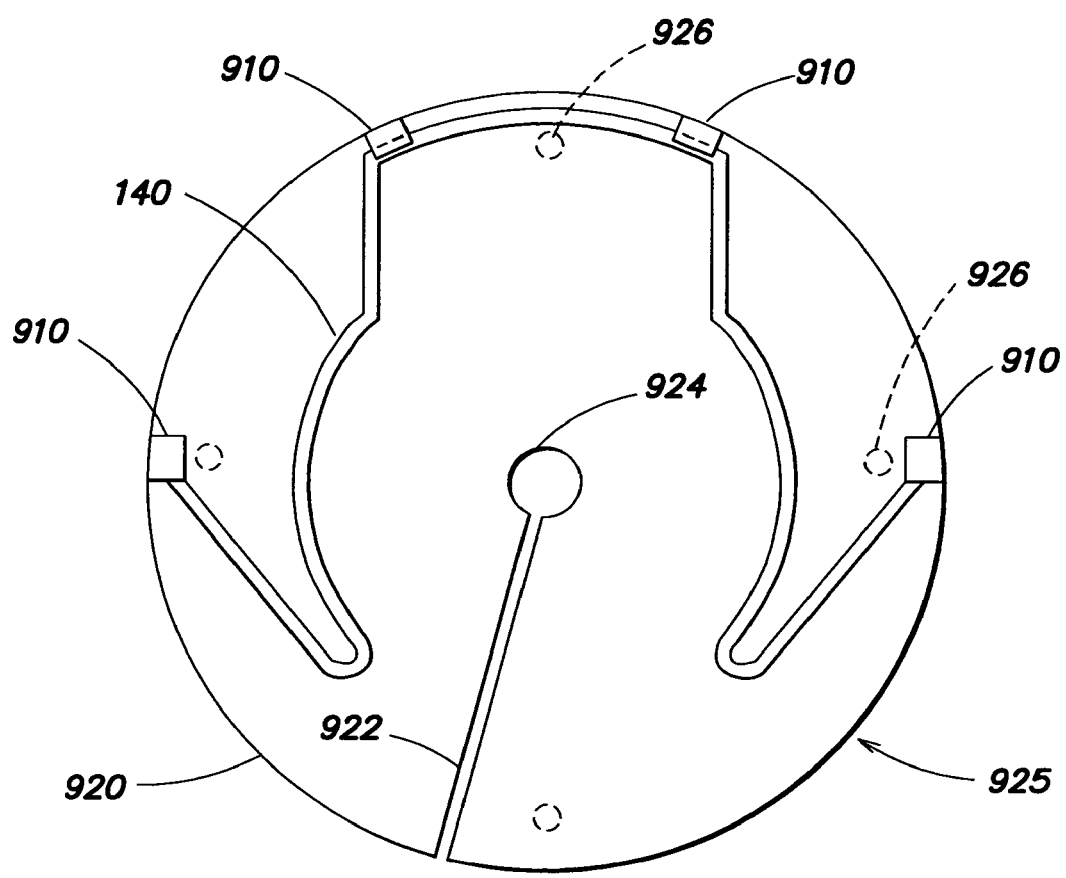
FIG. 9 is a top view of an alternative embodiment of a base for a vertical wafer boat according to another embodiment of the present invention.

FIG. 9 is a top view of a wafer boat base in accordance with another embodiment of the present invention. Advantageously, the base 925 may also be used with the wafer support 140 previously illustrated and described. As in the previously described embodiment, the base 925 is typically generally circular in shape and includes a generally horizontal flat base plate 920 having a predetermined diameter. The base 925 may also include a plurality of feet 926 (shown in phantom in FIG. 9) that are spaced apart from one another about a perimeter of the under-surface of the base plate 920. In the illustrated embodiment, the plurality of feet include four feet disposed at approximately 90° apart from one another, although it should be appreciated that more or fewer feet may be provided, or alternatively rather than feet, a vertical rim may be provided, as described in the '497 patent). As in the previous embodiment, the base 925 may also include a locating feature (not shown) to position the wafer boat 100 in a predetermined orientation when placed in a vertical furnace.

As in the previous embodiment, the base 925 may include an expansion slot 922 that is cut radially outward from a center hole 924 in the base plate 920 and which may extend through the outer periphery of the base plate 920 to allow for thermal expansion and contraction of the base 925. However, in contrast to the previously described embodiment, rather than including three vertical support rods 110 positioned approximately equidistantly about the outer perimeter of the base plate 120, the base 925 may include four vertical support rods 910. Two of the vertical support rods 910 (i.e. the pair positioned at 3 o' clock and 9 o' clock) may be positioned 180° degrees apart from one another in a manner similar to that shown in FIG. 2, while the remaining two vertical support rods 910 may be offset equally from approximately the center of the arcuately curved section 145 of the wafer support 140 (e.g., at an approximately 11 o' clock position and a 1 o' clock position). The use of four vertical support rods 910 may be useful for larger wafer sizes or where more rigidity is desired. The remaining portions of a wafer boat utilizing the base 925 (e.g., the vertical support rods, the top plate, etc.) may be similar to those previously described (although the top plate would instead be attached to four vertical support rods, rather than three).

It should be appreciated that the wafer boats described herein provide numerous advantages over conventional wafer boat designs. For example, in contrast to conventional designs wherein the wafer support structures are formed in conjunction with the body of the wafer boat and permanently attached to the body of the carrier or boat, the wafer supports of the present invention may be manufactured independently of the body of the wafer boat.

Because the wafer supports may be manufactured independently of the body of the wafer boat, the surface finish of the wafer supports can be improved, as there are no geometric or tooling constraints normally associated with a fixed rack design. It should be appreciated that in a conventional rack design, the finish on surfaces where the horizontal wafer support surface meets a vertical support member may be difficult to adequately polish. Moreover, the difficult geometry of such fixed rack designs can make it difficult to ensure that the wafer support surfaces are uniform in finish and spacing. Because the wafer supports of the present invention may be manufactured independently of the body of the wafer boat, they may be manufactured in volume, ensuring uniformity. This uniformity simplifies integration with existing wafer transfer systems by having easily established datum surfaces. Further, the open and flat design of the wafer support structures facilitates machining and permits the surface finish of the wafer supports to be easily polished.

During final steps of the manufacturing process, each of the plurality of wafer supports 140 may be inserted into the body of the wafer boat 100 and then welded or otherwise fixedly attached to the body of the wafer boat 100 to form a monolithic structure. Alternatively, the plurality of wafer supports need not be fixedly attached to the body of the wafer boat during manufacture, and may instead be inserted and/or removed thereafter. This permits the wafer supports to be inserted and removed on-site, and indeed, the wafer supports may be packaged and/or shipped and/or installed separately from the body of the wafer boat. Should one of the wafer supports wear or break during use, or break during shipment, a new one may be provided. This is in contrast to conventional designs, where should one of the support structures fail or be damaged, the entire wafer boat may need to be scrapped.

It should be appreciated that the ability to install the individual wafer support structures of the present invention independently of the carrier in which they are inserted facilitates handling. Conventional rigid boat designs are both heavy (some weighing over 10 Kg) and fragile. However, because the individual wafer support structures of the present invention may be installed after the body of the wafer carrier or boat is in place, the weight and fragility of the body of the boat is reduced, facilitating operator handling. Further, it should be appreciated that different sizes of the wafer support structures may be provided to accommodate different sized wafers while utilizing the same vertical rack design, such that the body of the wafer boat may be used with varying wafer sizes simply by replacing the wafer supports.

The individual wafer support structures support the wafer close to the center of the wafer to reduce crystallographic slip and gravitational stress. The open geometry of the individual wafer supports promotes better gas flow and permits use with existing wafer transfer systems. Moreover, the thinness of the design reduces the thermal mass of the wafer support structures, thereby promoting more uniform oxidation, reducing thermal gradients and making them more uniform, and increasing the radiation view factor between the wafers and the furnace chamber. Because the individual wafer supports mate with the vertical supports using a positive interference fit, and because this mating is spread along a line of contact, rather than a single point, the design minimizes the possibility of movement of the wafer supports, particle generation, and catastrophic failure.

In accordance with another aspect of the present invention, techniques for fabricating ceramic articles are now described in detail. This aspect of the present invention provides inert ceramic articles that have high purity and are dimensionally stable as well as techniques for producing such ceramic articles. The techniques of the present invention can be utilized to fabricate a variety of ceramic articles including, for example, articles requiring high purity components, articles having high temperature dimensional stability, and/or articles that are chemically inert. For example, the techniques of the present invention can be utilized to fabricate articles suitable as electrical components such as wafer boats or carriers, capacitors and resistors, as refractory materials, or even as dinnerware articles. The term "high purity" refers to ceramic materials having an active impurity component of less than about 400 ppm. The phrase "active impurity component" or "active impurity" refers to any species that can be transferred from the ceramic article into a substrate or working article before, during or after processing of the substrate or article when such substrate or working article comes in contact or in proximity with the ceramic article. For example, the present invention can provide ceramic articles used as wafer boats suitable for supporting semiconductor wafers during semiconductor wafer processing operations. The ceramic wafer boats of the present invention can have an active impurity component, of less than 400 ppm, which are typically metal species such as iron, copper, nickel, chromium, and, in some cases, calcium, which can migrate from the ceramic matrix to the semiconductor wafer when the semiconductor wafer is disposed in the wafer boat during, for example, processing of the semiconductor wafer. The phrase "active impurity component" contrasts with the phrase "inert impurity component." The latter refers to any species that may be present in the ceramic matrix that does not affect or contaminate a substrate or working article. For example, during semiconductor wafer processing, an inert impurity component can be any species, such as yttrium, that may migrate from the ceramic article but does not affect the utility or pertinent operational properties of the semiconductor wafer.

As used herein, the phrase "boil-off" typically refers to any processing operation wherein any impurity component, active or inert, is removed from the ceramic matrix or otherwise rendered immobile and bound within the ceramic matrix.

The impurity component concentration can be determined by utilizing any technique that measures concentration. For example, the impurity concentration can be determined by performing an inductively coupled plasma analysis (optical emission or mass spectroscopy), a glow discharge mass spectrometric analysis, or a secondary ion mass spectrometric analysis.

The ceramic articles of the present invention can be characterized as being recrystallized ceramic materials that typically have grain structures that are resistant to oxidation degradation during use because, it is believed, of their low surface area. The grain structure of the ceramic articles also permits thermal, chemical, and mechanical cleaning or removal of undesirable impurities, especially active, non-inert impurity components, or contaminants. The ceramic articles of the present invention can be further characterized as being substantially free of silicon which decreases any likelihood of diffusion which, in turn, can provide lower impurity transfer especially during, for example, high temperature silicon wafer annealing processes, such as argon annealing, hydrogen annealing as well as during silicon-on-insulator (SOI) substrate processing. The ceramic articles of the present invention can also be characterized as being fabricated without an impregnation step, specifically without a silicon impregnation step, which can increase yield, decrease the number of machining processes and costs, and improves production capacity.

In accordance with one or more embodiments, the present invention provides a method of preparing a ceramic article by recrystallizing a ceramic material. The ceramic material can be silicon carbide, silicon nitride, and, in some cases, aluminum oxide. The method can comprise providing a green component comprised of ceramic powder and vaporizing or removing at least a portion of any undesirable contaminant or impurity components from the ceramic powder. The method can also be characterized to include recrystallizing the ceramic powder to form grains, in at least a portion of the article, with a predetermined pore size as well as a predetermined concentration of impurities, active impurity components or both active and inert impurity components. The phrase "green component" refers to a ceramic article before being processed to have a ceramic crystal structure.

In accordance with one or more embodiments, the present invention provides a method of fabricating a ceramic article. The method can comprise forming a molded component comprising a ceramic powder and sintering the molded component at a temperature sufficient to vaporize or boil-off any impurity components and promote recrystallization of the ceramic material to obtain a pore size that limits or at least reduces the surface area of the formed ceramic crystals. In accordance with some embodiments of the invention, the sintering operation can be performed until the ceramic material has been sufficiently recrystallized to reduce the surface area of the ceramic material to reduce or inhibit oxidation of a component of the ceramic material. Further, sintering can be performed at any suitable temperature that promotes grain growth and vaporization of impurity components. In accordance with one or more embodiments of the invention, a ceramic article comprised of silicon carbide can be sintered at about 2200° to about 2500° C. to produce a sintered component having a pore size of at least about 5 μm, at least about 10 μm, preferably at least about 15 μm, in some cases at least about 20 μm, and in other cases at least about 25 μm. Because, it is believed, the surface area is inversely related to the pore size, a pore size of at least about 15 μm can reduce the likelihood of the formation of silica during, for example, use of the ceramic article in semiconductor wafer processing operations. However, the desired pore size may be influenced by other factors including, for example, the particular use or service of the ceramic article. Thus, a pore size of at least about 5 μm may be suitable for particular situations.

In accordance with other aspects, the present invention can be characterized as providing a ceramic article having a pore surface area of less than about $0.04 \text{ m}^2/\text{gr}$, preferably less than about $0.02 \text{ m}^2/\text{gr}$. Pore surface area can be measured using any suitable technique including, for example, utilizing a BET analyzer using condensation of nitrogen gas.

Pore size refers to voids or spaces, which can be interconnected to form a network. Pore size can be measured by any suitable technique. For example, pore size can be determined by mercury infiltration techniques which typically utilizes a mercury porosimeter and can provide a distribution of pore sizes within the ceramic. As used herein, "pore size" refers to the median pore size, 50% of the distribution of pore volume.

Sintering can be performed at lower temperatures but may require relatively longer sintering periods to achieve the desired properties. Further, higher sintering temperatures may be utilized but may promote volatilization of the ceramic matrix material.

In accordance some embodiments of the invention, sintering can be performed until the concentration of impurity components, typically active impurity components, is less than about 400 ppm; in some cases, less than about 200 ppm; in other cases, less than about 100 ppm; in still other cases, less than about 50 ppm; in yet other cases, less than about 10 ppm; and even less than about 1 ppm. For example, sintering can be performed for several hours, typically at least about two hours but sintering may be performed as long as six hours. The sintering period can depend on several factors including, but not limited to, the vacuum level during sintering, the heating rate, the cooling rate, the geometric complexity of the ceramic article, as well as the ratio of exposed surface area relative to the volume of the ceramic article.

Heating during sintering can be performed at any suitable heating rate. For example, heating can be performed at a rate of about 3° C. per minute.

In accordance with other embodiments of the present invention, sintering can be performed in an atmosphere that promotes removal of impurity components, preferably active impurity components. For example, sintering can be performed under a vacuum pressure of less than about 10 torr until the desired active impurity component concentration has been achieved. Further, the applied vacuum can be varied throughout the sintering operation. Sintering can also be performed under an atmosphere comprising hydrogen chloride or chlorine with or without oxygen or air or other suitable atmosphere that removes or forms a compound with any active impurity component but, preferably, does not promote carburization. For example, a silicon carbide component can be sintered at about 1850° C. under an atmosphere comprising hydrogen chloride or chlorine, followed by cooling to between about 1000° and about 1100° C. in an oxidizing atmosphere, such as an atmosphere comprising air, to burn off any carbon formed. Sintering can further include heating to at least about 2200° C. to promote grain growth.

Further, sintering can be performed until all impurity components, a single component, or a portion of any impurity component has been removed to a desired concentration level. In accordance with further embodiments of the invention, sintering can be performed until the entire ceramic article has achieved the desired properties or until a portion of the ceramic article has achieved the desired properties. For example, sintering can be performed until the entire ceramic article has the desired active impurity component concentration and/or the desired pore size or until an outer or surface layer has the desired active impurity concentration and/or the desired pore size. Thus in some embodiments of the invention, the ceramic article can have a gradient of active impurity concentration, from the exposed surface to its inner core layer. Likewise, the ceramic article can have a porosity gradient from the surface to its inner core layer.

In accordance with one or more embodiments of the invention, specifically where the ceramic article comprises silicon carbide, a sintering temperature of less than about 2200° C., it is believed, does not provide commercially viable grain growth rates or, in some cases, may not result in a sufficiently recrystallized the silicon carbide matrix. Moreover, sintering silicon carbide at a temperature of less than about 2200° C. may not appreciably vaporize or boil-off a sufficient fraction of any impurity components or may not do so at commercially viable rates. Conversely, a sintering temperature greater than about 2500° C. may result in an undesirable vaporization of the silicon from the silicon carbide matrix.

The method in accordance with one or more embodiments of the invention can further comprise washing the sintered component. The sintered component can be washed with any suitable solution capable of removing impurities that may be present on, for example, the surface of the component. For example, the washing solution can comprise any solution capable of dissolving, solubilizing, or at least rendering any active impurity components removable by a washing and/or rinsing solution.

The washing solution can comprise an acid solution, which can comprise at least one acid selected from the group consisting of hydrochloric acid, nitric acid, and hydrofluoric acid. The acid solution can be prepared by combining hydrochloric acid with a compound that is a precursor of hydrofluoric acid. For example, an acid solution can be prepared by incorporating ammonium fluoride or ammonium bifluoride with hydrochloric acid. The ammonium fluorinated compounds, in the presence of hydrochloric acid, are typically converted to hydrofluoric acid.

Any concentration of the acid or acids in the acid solution can be utilized to practice the present invention that sufficiently removes or dissolves impurities from the ceramic article. For example, the acid concentration of the acid solution can be at least about 30%, in water. An acid concentration of less than 30% may not be effective at removing or solubilizing any active impurity components such as iron, nickel, copper, chromium, and, in some cases, calcium.

Washing can be performed at any washing solution temperature that promotes wetting of the component by the solution and the solubility of any undesirable impurity components. For example, a temperature of about 20° to about 80° C. can be used with an acid solution to dissolve active impurity components from a silicon carbide article because, it is believed, a temperature of less than about 20° C. is not effective in cleaning and a temperature of greater than about 80° C. may vaporize the acid solution.

Washing can be performed for any duration. For example, acid washing a silicon carbide article can be performed by exposing, typically by dipping, the article in the acid solution for at least about four hours to about eight hours because, it is believed, a washing time of less than about two hours would be ineffective in wetting and promoting removal of the impurities.

Washing can further include rinsing any residual washing solution with a rinsing solution that is contaminant- or impurity-free. For example, deionized water with a resistivity of at least about 14 mega-ohms can be used to rinse acid solution. Rinsing can be performed at any temperature including, for example, room temperature between about 15° to about 25° C., until substantially all the washing solution has been removed. The washing/rinsing operations may be repeated several times.

The method of the invention can further comprise forming at least one feature on the molded component and/or on the sintered component. A feature can be any structure, element or characteristic on, for example, a surface of the ceramic article. For example, the ceramic article can have features depicted exemplarily in FIG. 5 including, but not limited to, teeth 112. Thus, in accordance with the articles and techniques of the present invention, one or more features such as teeth 112 can be formed on one or more vertical support rods 110. Features can be formed on a molded component and/or on a sintered component.

Features can be fabricated by molding; casting, including slip casting; pressing under pressure; extruding; or cutting from a billet. Features can also be fabricated by machining operations. For example, features can be created by slip casting, such as by consolidating a slurry comprised of silicon carbide and water in a mold having corresponding structures that provide desired features on the ceramic component. Further machining operations can be performed to cut additional features on cast or molded articles. Features can also be created after sintering operations have been performed.

In accordance with one or more embodiments, finishing operations may be performed to provide additional features as well to, for example, produce a component with dimensions within acceptable dimensional and/or finish tolerance. Such operations include, for example, machining, grinding, or polishing techniques.

The method can further include forming a trapping oxide layer on the sintered ceramic component. Oxidation typically involves creating an oxide layer on a surface of the sintered component to trap and remove any surface impurity components. Forming the oxide layer can comprise heating the ceramic article, typically the sintered component, under an atmosphere and at a temperature and for a duration sufficient to form an oxide layer that is, preferably, at least about 0.2 µm thick. For example, a silicon carbide article can be oxidized at about 1000° to about 1300° C., preferably about 1200° to about 1300° C., under an oxidizing atmosphere. The oxidizing atmosphere can comprise oxygen and at least one chlorinated species selected from the group consisting of chlorine, hydrogen chloride, dichloroethylene, and trichloroethane. Oxidation at a temperature less than about 1000° C. can be performed but may not promote formation of an oxidation layer at a desirable rate. Oxidation at a temperature greater than 1300° C. can also be performed but may promote formation of $SiCl_x$ species, typically under the oxide layer, which may be undesirable in certain cases.

The oxide layer can then be removed from the sintered component by, for example, washing the sintered component with an acid solution such as the acid solution described above. Removing the oxide layer can further comprise rinsing any acid away from the sintered component with water. The oxide layer promotes removal of any undesirable contaminants or impurities by trapping any such species within the oxide layer matrix. Removal of the oxide layer consequentially removes such trapped undesirable species. The formation of such surface oxide layer can be performed on all or only a portion of any surface of the sintered, recrystallized component or components. Further, the formation and subsequent removal of the trapping oxide layer can be repeated as necessary.

In accordance with one or more embodiments, the present invention provides an article comprising a ceramic material selected from the group consisting of silicon carbide, silicon nitride, and aluminum oxide. The ceramic material can have a pore size of at least about 15 μm and an active impurity component at a concentration of less than about 400 ppm. The active impurity component comprises at least one metal selected from the group consisting of iron, copper, nickel, and chromium. In some embodiments of the invention, the concentration can be less than about 200 ppm, less than about 100 ppm, less than about 50 ppm, less than about 10 ppm, or even less than about 1 ppm. The ceramic material can comprise recrystallized silicon carbide. The ceramic material can further comprise an inert impurity component.

In accordance with one or more embodiments, the present invention provides a wafer boat comprising a base and at least one support rod. At least one of the base and the support rod can comprise silicon carbide having a pore size of at least about 15 μm and an active impurity component at a concentration of less than about 400 ppm.

In accordance with one or more embodiments, the present invention provides a method of fabricating a component of a wafer boat. The method can comprise providing a molded component comprising a ceramic selected from the group consisting of silicon carbide, silicon nitride, and aluminum oxide, sintering the molded component at a temperature of about 2200° to about 2500° C. to form a sintered wafer boat component, washing the sintered wafer boat component with an acid solution comprising at least one acid selected from the group consisting of hydrofluoric acid, hydrochloric acid, and nitric acid, and rinsing the sintered wafer boat component with water. The method can further comprise forming at least one surface feature on the sintered wafer boat component, forming a first oxide layer on a surface of the sintered wafer boat component and removing the first oxide layer from the surface of the sintered wafer boat component, and forming a second oxide layer on a surface of the sintered wafer boat component and removing the second oxide layer after forming and removing the first oxide layer.

The present invention can be further understood in view of the following examples, which are illustrative in nature and are not to be considered as limiting the scope of the invention.

EXAMPLES

In the examples, fine silicon carbide (SiC) powder with a median particle size of about 2 μm and coarse SiC grain with a median size of about 100 μm were mixed with about 15 wt % sodium silicate and 1 wt % latex binder to form a stable slurry using a ball mill.

The slurry was cast into rectangular bars, about 1"×3", with a density of about 2.56 g/cc, using a plaster mold. The bars were dried at about 110° C. and machined in the green state to remove about 0.5 mm from the surface.

The machined samples were sintered at several different sintering conditions to optimize the recrystallization and purification processes as discussed in Examples 1 and 2.

Example 1

Figure 10:
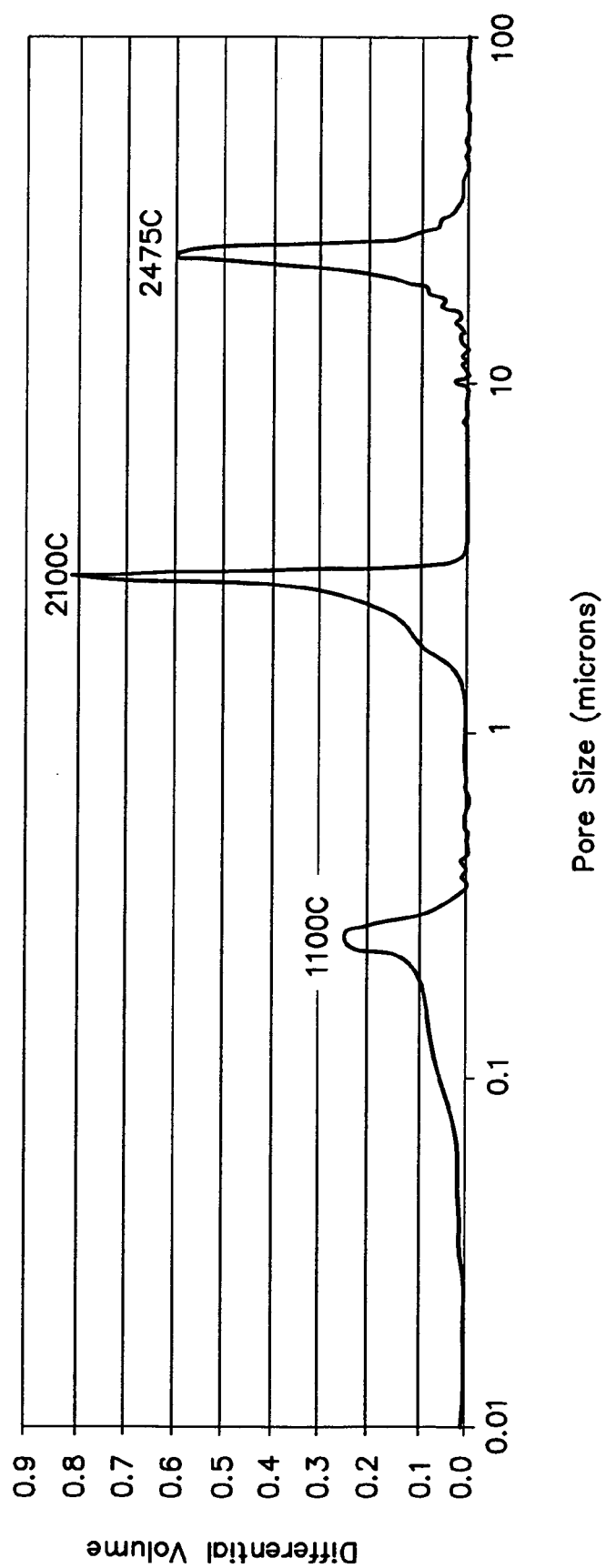
FIG. 10 is a graph showing the pore sizes of ceramic article sintered at various temperatures in accordance with one or more embodiments of the present invention.

Machined samples were heated at different sintering temperatures, from about 1800° C. to about 2500° C., to determine preferable conditions for obtaining a fully recrystallized structure. The pore size monotonically increased from less than about 0.25 μm, as observed in the unfired sample, to greater than about 15 μm, as observed in the sample sintered at about 2400° C., as shown in FIG. 10.

Figure 11:
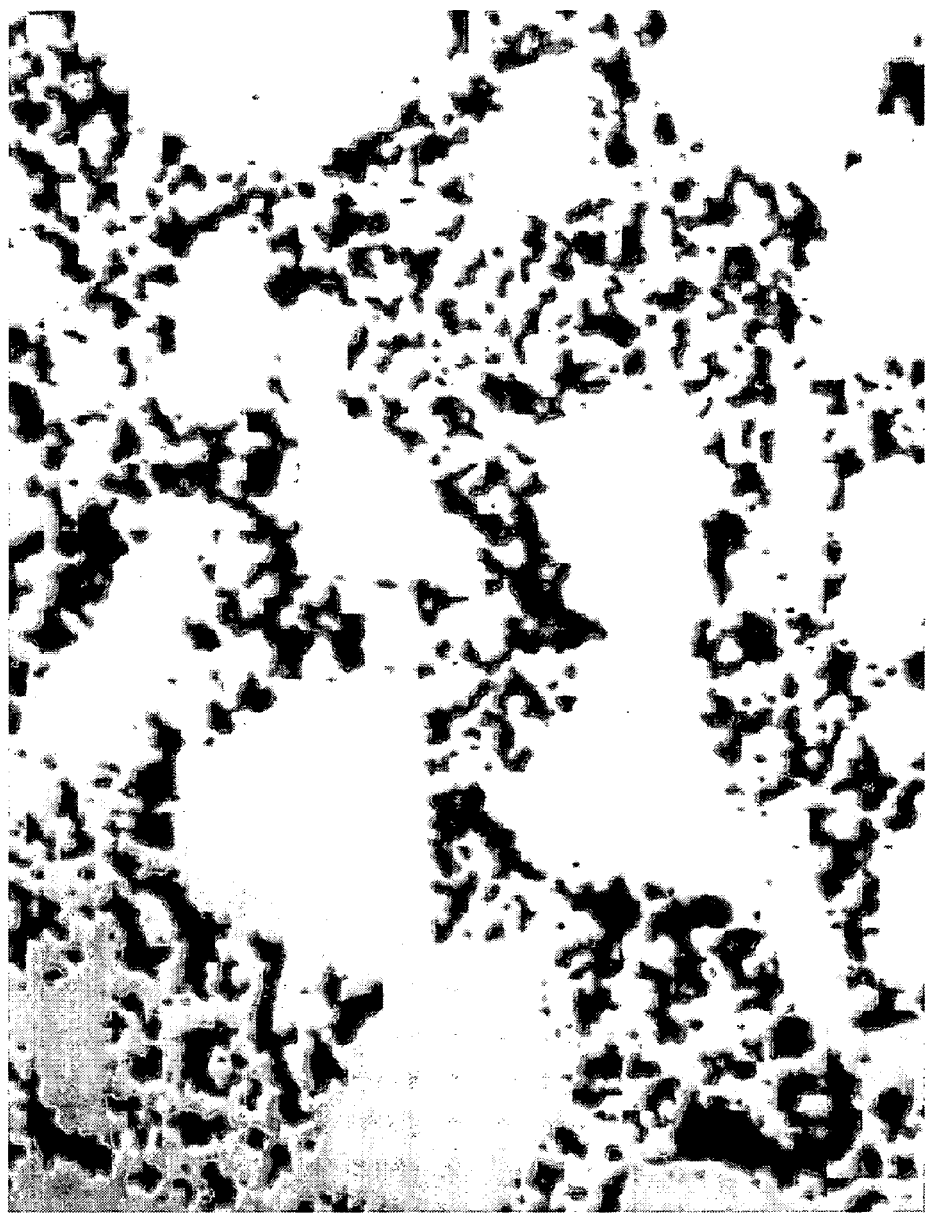
FIG. 11 is a copy of a photomicrograph of a recrystallized silicon carbide material sintered at about 1950° C. and about 0.9 torr for about two hours in accordance with one or more embodiments of the present invention.
Figure 12:
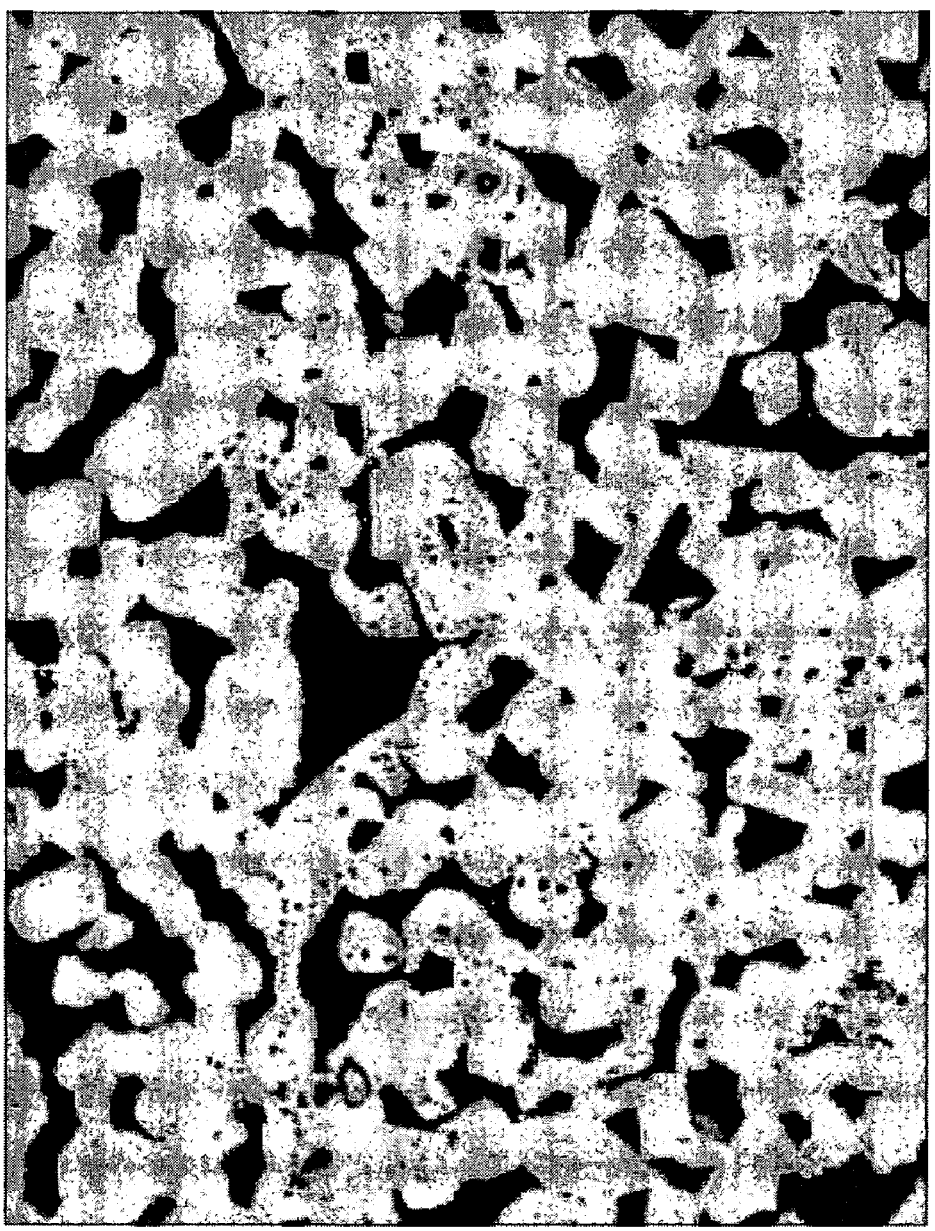
FIG. 12 is a copy of a photomicrograph of a recrystallized silicon carbide material sintered at about 2475° C. and about 760 torr for about two hours in accordance with one or more embodiments of the present invention.

Comparative results from two different sintering conditions: about 1950° C. at about 0.9 torr for about two hours and about 2475° C. at about 760 torr for about two hours, as shown in FIGS. 11 and 12. Clear differences were observed about the extent of recrystallization between the two sintering conditions. The sample sintered at about 1950° C. recrystallized to a pore size of about 8.8 μm (median pore size) while the sample sintered at about 2475° C. recrystallized to a pore size of about 25.8 μm (median pore size). Copies of photomicrographs of polished cross-sections from the samples sintered at about 1950° C. and 2475° C. are shown in FIGS. 11 and 12, respectively. Fine and coarse grains can also be observed in the sample heated at about 1950° C., while a more recrystallized structure, with little or no remaining fine grains, can be observed in the sample sintered at about 2475° C.

Recrystallization at 2475° C. can provide a ceramic article with a reduced surface area which can reduce or provide a low oxidation rate when such article is used at high temperatures, especially in oxidizing atmospheres. Further, lower oxidation rate can reduce or even minimize any dimensional changes during use. Thus, the article and techniques of the present invention can provide an inert wafer boat suitable for use in semiconductor wafer processing applications.

Example 2

Machined samples were heated at different vacuum levels, from about 0.6 to about 600 torr, and sintered at various temperatures, from about 1650° C. to about 2000° C., to determine preferable processing conditions. A vacuum level below about 10 torr, e.g. about 6 torr, appears to provide good impurity removal during sintering as shown in Table 1.

TABLE 1

Impurity concentration at various processing conditions.

| Temperature (° C.) | Pressure (torr) | Fe (ppm) | Ni (ppm) |
|---|---|---|---|
| 1850 | 6 | 2 | 0.3 |
| 1850 | 0.6 | 0.2 | 0.3 |
| 1850 | 600 | 357 | 85 |
| 2000 | 6 | 0.2 | 0.3 |
| 2000 | 0.6 | 0.2 | 0.3 |
| 2000 | 600 | 0.2 | 5 |

Thus in addition to the high sintering temperature, between about 2200° and about 2500° C., as described in Example 1, the techniques of the present invention can be conducted utilizing vacuum conditions, e.g., less than about 6 torr pressure, to promote volatilization of impurities and provide a high purity ceramic article, such as a wafer boat suitable for use during annealing processes of silicon semiconductor wafers.

Thus, the process of the present invention can be conducted in vacuum pressure of less than about 10 torr to promote volatilization of impurities and obtain a high purity ceramic article that can be used as wafer boats suitable during annealing processes of silicon wafers.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the scope of the invention. Accordingly, the foregoing description and drawings are by way of example only.

What is claimed is:

1. A wafer boat having a plurality of teeth for receiving a plurality of wafers, the wafer boat comprising recrystallized silicon carbide having a pore size of at least about 15 μm with a pore surface area of less than about 0.04 m²/g and comprising impurities of iron, copper, nickel, chromium, and calcium at a total concentration of less than about 200 ppm.

2. The wafer boat of claim 1, wherein the recrystallized silicon carbide further comprises inert impurities.

3. The wafer boat of claim 1, wherein the wafer boat has pores interconnected to form a network and comprising an active impurity component at a concentration of less than 1 ppm, wherein the active impurity component is one of iron, copper, nickel, chromium, and calcium.

4. The wafer boat of claim 1, having a nickel concentration at or below 5 ppm.

5. The wafer boat of claim 4, wherein the silicon carbide member is free of free silicon.

6. The wafer boat of claim 4, wherein the silicon carbide member has a Fe concentration at or below 2 ppm,.

7. The wafer boat of claim 3, comprising:
a base plate;
a top plate;
a plurality of support rods disposed about a perimeter of the base plate and extending between the base plate and the top plate, each support rod of the plurality of support rods having a first distal end that is attached to the base plate and a second distal end that is attached to the top plate, each support rod including a plurality of slots, wherein each slot is disposed between immediately adjacent teeth within the plurality of teeth; and
a plurality of wafer supports, each of the plurality of wafer supports adapted to be received in a corresponding slot of each of the plurality of support rods, each of the plurality of wafer supports having a continuous open shape and including a pair of leg sections that form an interference fit with at least two of the plurality of support rods.

8. The wafer boat of claim 7, wherein the plurality of support rods includes first, second, and third support rods, the first and second support rods being disposed approximately one hundred and eighty degrees apart from one another about the perimeter of the base plate, and the third support rod being disposed on the perimeter of the base plate approximately ninety degrees apart from the first and second support rods.

9. The wafer boat of claim 8, wherein the top plate has a generally circular shape having a central hole formed therein, the top plate including an expansion slot that extends radially outward from the central hole in the top plate and through an outer periphery of the top plate.

10. The wafer boat of claim 9, wherein each of the plurality of wafer supports includes a continuous flat member having an open shape, the continuous flat member including a plurality of inter-connected arcuately curved sections, two of the arcuately curved sections defining an arc of approximately ninety degrees and adapted to support a wafer of the plurality of wafers at approximately a b 0.7R boundary region of the wafer where R is a radius of the wafer, each of the two arcuately curved sections being connected to a respective leg section of the pair of leg sections and terminating in a free distal end;
wherein each of the free distal ends is shaped to form the interference fit with a slot of a respective one of the at least two support rods.

11. The wafer boat of claim 10, wherein the top plate has a C-shape, and wherein an open end of the C-shape is aligned with the expansion slot in the base plate.

12. The wafer boat of claim 10, wherein the free distal ends of each continuous flat member are mitered to engage with the slot of a respective one of the at least two support rods along a line of contact.

13. The wafer boat of claim 7, wherein the plurality of support rods includes first, second, third, and fourth support rods, the first and second support rods being disposed approximately one hundred and eighty degrees apart from one another about the perimeter of the base plate, and the third and fourth support rods being disposed on the perimeter of the base plate at positions that are approximately equidistant from a position on the perimeter of the base plate that is spaced approximately ninety degrees apart from the first and second support rods.

14. The wafer boat of claim 7, wherein the plurality of wafer supports can be at least one of inserted in and removed from the plurality of slots formed in the plurality of supports rods, and wherein the pair of leg sections of each of the plurality of wafer supports removably forms an interference fit with a respective one of the at least two of the plurality of support rods.

15. The wafer boat of claim 1, wherein the wafer boat consists essentially of recrystallized silicon carbide.

* * * * *